United States Patent [19]

Yang

[11] Patent Number: 5,731,986
[45] Date of Patent: Mar. 24, 1998

[54] METHOD OF DOWNSIZING GRAPHIC DATA OF A MASK PATTERN STORED IN A HIERARCHICAL GRAPHIC DATABASE

[75] Inventor: Shy-Lun Yang, Kaohsiung City, Taiwan

[73] Assignee: Winbond Electronics Corporation, Taiwan

[21] Appl. No.: 643,359

[22] Filed: May 6, 1996

[51] Int. Cl.$^6$ .................................................. G06F 17/50
[52] U.S. Cl. .......................... 364/491; 364/490; 364/489; 364/488
[58] Field of Search .................... 364/488, 489, 364/490, 491, 468; 395/500, 120; 430/5

[56] References Cited

U.S. PATENT DOCUMENTS

| | | | |
|---|---|---|---|
| 5,253,182 | 10/1993 | Suzuki | 364/489 |
| 5,283,746 | 2/1994 | Cummings et al. | 364/468 |
| 5,416,720 | 5/1995 | Fukui | 364/489 |
| 5,416,722 | 5/1995 | Edwards | 364/491 |
| 5,441,834 | 8/1995 | Takekuma et al. | 430/5 |
| 5,448,494 | 9/1995 | Kobayashi et al. | 364/489 |
| 5,493,510 | 2/1996 | Shikata | 364/491 |
| 5,553,274 | 9/1996 | Liebmann | 395/500 |
| 5,598,344 | 1/1997 | Dangelo et al. | 364/489 |
| 5,629,861 | 5/1997 | Kim | 364/490 |

OTHER PUBLICATIONS

"Restructuring VLSI Layout Representations for Efficiency", by Nair et al., IEEE European Design Automation Conference, 1991, pp. 111–116.

"Hierarchical Critical Area Extraction with the EYE Tool", by Allan et al., IEEE Defect and Fault Tolerance in VLSI Systems, 1995 Int'l. Workshop, pp. 28–36.

*Primary Examiner*—Kevin J. Teska
*Assistant Examiner*—Russell W. Frejd
*Attorney, Agent, or Firm*—Rabin, Champagne, & Lynt, P.C.

[57] ABSTRACT

A method for downsizing graphic data of a mask pattern stored in a hierarchical graphic database so that the mask pattern can be used in fabrication of integrated circuits (ICs) having a reduced feature size. The method includes filling gaps formed between abutting graphic elements with supplementary graphic elements, without disturbing or modifying the overall hierarchical structure for recording and relating all the graphic elements in the mask pattern. Further, the method downsizes the graphic data of a mask pattern without greatly increasing the amount of required data storage in the hierarchical graphic database, which would burden the storage, transmission, and modification capacities of the mask pattern. The method includes the steps of: (1) downsizing the hierarchical graphic database; (2) flattening the downsized hierarchical graphic database; (3) oversizing the flattened hierarchical graphic database; (4) undersizing the oversized hierarchical graphic database; (5) performing a logical-NOT operation on the undersized hierarchical graphic database and the flattened hierarchical graphic database so as to obtain a gap-filling graphic element; and (6) incorporating the gap-filling graphic element in the downsized hierarchical graphic database.

29 Claims, 18 Drawing Sheets

(94,330)

(125,440)

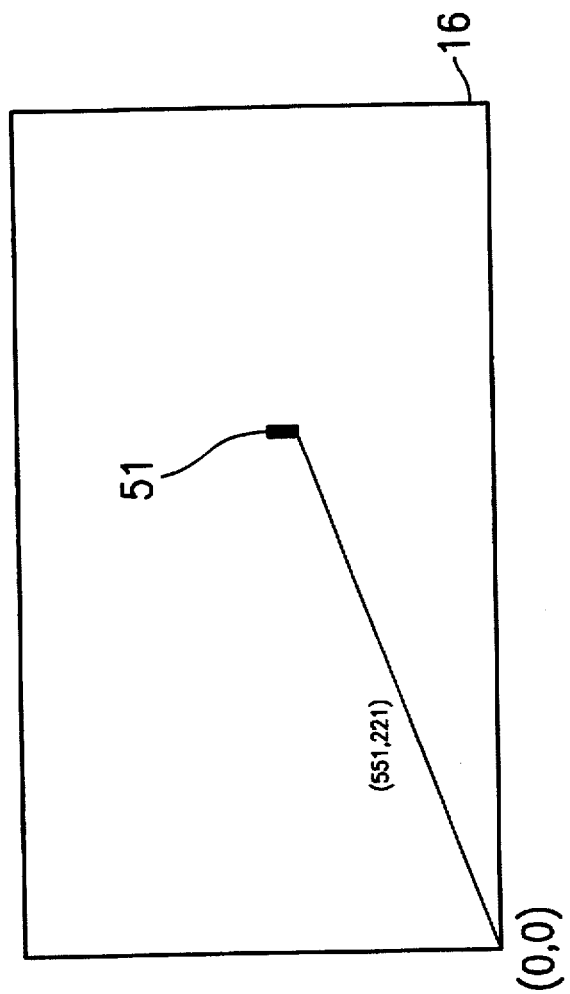

METHOD OF DOWNSIZING GRAPHIC DATA OF A MASK PATTERN STORED IN A HIERARCHICAL GRAPHIC DATABASE

BACKGROUND OF THE INVENTION

1. Field of the Invention

The invention relates to a hierarchical graphic database for goring the graphic data of a mask pattern used in semiconductor fabrication, and more particularly, to a method for downsizing the graphic data of a mask pattern recorded and stored in a hierarchical graphic database so as to allow the mask pattern to be also usable in the fabrication of integrated circuits (ICs) having a reduced feature size.

2. Description of the Related Art

In semiconductor fabrication, it is an essential step to use masks to define the size and shape of certain areas on the wafer that are used to fabricate various integrated circuit elements. The pattern of a mask is customarily drawn by using a computer which records and stores the graphic data of the mask pattern in a hierarchical graphic database. This allows a particular mask pattern to be repetitively used afterwards as many times as desired.

As semiconductor technology enters the submicron age, the feature size of the integrated circuits is being reduced from the earlier 1 µm level to the current 0.45 µm level, and even further down to the 0.25 µm level. As a consequence, an earlier-made mask with a feature size of 1 µm is not suitable for use at the 0.45 µm level of fabrication.

To overcome this problem, an approach is to directly downsize the hierarchical graphic database so as to reduce the size of the mask pattern. A drawback to this approach, however, is that gaps could be formed between two graphic elements in the mask pattern that are supposed to abut each other. These gaps would cause errors in the arrangement of integrated circuit elements on the wafer.

The hierarchical graphic database for storing the graphic data of a mask pattern is customarily organized in a tree-like hierarchical structure, with each node being a group that stores the data of individual graphic elements in the mask pattern. The groups in the hierarchical structure are associated with each other in a "parent-child" relationship. For instance, the GDS II/CIF format for integrated circuit fabrication is based on such a hierarchical structure. In the hierarchical structure, any group to which one or more other groups are subordinate is called a "parent group", and any group that is a subordinate of a parent group is called "child group". A parent group can also be a child group of another group and vice versa. The group at the highest level of the hierarchical structure that has no parent group above it is called the "root group". There is only one root group in a hierarchical structure. For example, in the hierarchical structure shown in FIG. 1A, the root group is the group 7 at the first level of the hierarchical structure and also acts as a parent group to two child groups 5, 6. Further, the child group 5 of the parent group 7 is in turn the parent group of two child groups 2, 4. The root group 7 is used as a reference to other groups. Customarily, the coordinate system for the root group is used as the absolute coordinate system for the mask pattern, with the origin being set at the coordinates (0,0).

Referring to FIG. 1B, there is illustrated an instance of how the hierarchical structure described above is used to store the graphic data (in this case, the graphic element 1 which is used to define a rectangular area on the wafer) of a mask pattern in a child group 10 and a parent group 20. In the child group 10, the defined reference coordinates of the graphic element 1 are set to be located at a displacement ($X_d$, $Y_d$) from the reference coordinates ($X_0$, $Y_0$) of the child group 10. In the parent group 20, the origin (X, Y) is used as the reference. When the child group 10 is referenced to the parent group 20, the new absolute coordinates (x, y) of the graphic element 1 in the parent group 20 can be obtained in accordance with the relation 15 showing the relative position of the group 10 in the group 20, and the displacement ($X_d'$, $Y_d'$).

Accordingly, in order to compute absolute coordinates (x, y) of the graphic element 1, the procedure should start with the parent group 20 in accordance with the relation 15 and transformation of relative coordinates level-by-level until the values of the absolute coordinates (x, y) of the graphic element 1 are found. For example, when the child group 10 is referenced to the parent group 20, there will be obtained a set of transformation coordinates (x', y') and a transformation displacement ($X_d''$, $Y_d''$) which, along with the displacement ($X_d'$, $L_d'$), allow the computer to find the absolute coordinates (x, y) of the graphic element 1.

An earlier conventional method for decreasing the feature size of the mask pattern is to directly downsize a number of selected parent groups (called "target groups") at a specific level by multiplying the transformation coordinate data of the target groups by a specified downsizing factor. However, a drawback to this conventional method is that it often results in coordinate data that are slightly deviated (due to rounding errors) from the expected values. As a consequence of the deviation, gaps could form between two graphic elements in the resulting mask pattern that are supposed to abut each other.

The foregoing drawback will be more clearly understood with reference to FIGS. 2A–2C. The mask pattern shown here includes two graphic elements 1, 3 and is stored in a hierarchical structure having three levels comprising the groups 12, 14, 16 respectively, the graphic element 1 being stored in the child group 12 and the graphic element 3 being stored in the parent group 16. The target group is the parent group 16 whose origin is set at (0,0). Based on the vector $d_1$, the transformation coordinates of the graphic element 1 in the group 12 are (80, 15); based on the vector $d_2$, the transformation coordinates of the group 12 in the group 14 are (125, 160); and based on the vector $d_3$, the transformation coordinates of the group 14 in the group 16 are (530, 120). The absolute coordinates (X, Y) of the graphic element 3 in the group 16 can be found based on the vector $d_4$ to be (735, 295) by simply adding the adding the vectors $d_1$, $d_2$, $d_3$, i.e., $$(X, Y) = (80, 15) + (125, 160) + (530, 120)$$
$$= (735, 295)$$

Since the two graphic elements 1, 3 abut on each other, the transformation coordinates of a particular point of the graphic element 1 in the group 16 must be the precisely the same as that of the abutting point of the graphic element 3 in the group 16; otherwise, the two graphic elements 1, 3 could be disposed apart with a gap formed therebetween.

In floating point arithmetic operations by a computer, all or part of the mantissa of the resulting real value is usually rounded to the nearest value. For example, if the downsizing factor is 75%, the absolute coordinates (X, Y) of the graphic element 1 in the group 16 after downsizing will be:

$$(X, Y) = (80, 15) \times 75\% + (125, 160) \times 75\% + (530, 120) \times 75\%$$
$$= (60, 11) + (94, 120) + (398, 90)$$
$$= (552, 221)$$

whereas the absolute coordinates of the graphic element 3 in the group 16 will be:

$$(X, Y) = (735, 295) \times 75\% = (551, 221)$$

As illustrated in FIG. 2B, The difference between (552, 221) and (551,221) causes a gap G1 to be formed between the two graphic elements 1, 3 after they are downsized by a factor of 75%. FIG. 2C further shows an enlarged view of part of FIG. 2B so as to more clearly illustrate the undesired formation of the gap G1 between the two graphic elements 1, 3.

Moreover, the error in the rounded values of transformation coordinates computed for the graphic element in that child group could accumulate each time an additional child group is incorporated into the mask pattern. The greater the level of the child group, the larger is the accumulated deviation, thus resulting in a larger gap.

To solve the foregoing problem, a conventional method is to flatten a number of selected target groups so as to obtain the absolute coordinate data for all the graphic elements therein and then multiply all the absolute coordinate data by the desired downsizing factor. By this method, graphic elements that have the same absolute coordinates will have their new absolute coordinate data rounded in the same way. Therefore, two abutting graphic elements will remain abutted and a gap will not appear therebetween.

For example, FIG. 3A shows two abutting graphic elements that have the same absolute coordinates (125, 440), which after being downsized by a factor of 75%, will become (93.75, 330). Rounded, the new absolute coordinates will be (94, 330). Thus, even if the graphic elements were located in different groups, the new abutting absolute coordinates remain identical by calculating absolute coordinates in the target group before applying the downsizing factor. As further shown in FIG. 3B, since the two graphic elements are to be plotted by reference to the same absolute coordinates (94, 330), they will remain abutted on each other.

It is a drawback, however, of the foregoing method that the amount of data in the hierarchical graphic database will be greatly increased. As shown in FIG. 4A, when a pattern 5 is to be recorded in a hierarchical graphic database, the child group 42 can be associated with a parent group 44 in such a manner that the pattern 5 can be manifoldly referenced by the parent group 44 at a number of positions 5a, 5b, 5c, 5d, and 5e. This allows a repetitive graphic element in the mask pattern to be recorded only once in a single child group so as to reduce the amount of data storage in the hierarchical graphic database. As further shown in FIG. 4B, after being reconstructed on the parent group 44, the pattern 5 shown in FIG. 4A appears repetitively at five different positions 5a', 5b', 5c', 5d', and 5e' in the parent group 44. This causes the amount of data storage in the hierarchical graphic database to be greatly increased because absolute coordinates must be calculated for each instance of the pattern 5 in the parent group 44 prior to downsizing. This effectively negates a main advantage of using a hierarchical database.

For example, for a hierarchical structure of 1.9 MB(Mega Byte), the flattening thereof would cause the number of bytes to be expanded to about 98 MB, which is about 50 times the original byte amount and which creates a burden on the storage, transmission, and modification of the mask pattern.

SUMMARY OF THE INVENTION

It is therefore an object of the invention to provide a method for downsizing graphic data of a mask pattern stored in a hierarchical graphic database without allowing gaps to be formed between abutting graphic elements.

It is another object of the invention to provide a method for downsizing the graphic data of a mask pattern stored in a hierarchical graphic database without allowing the amount of data stored in the hierarchical graphic database to be excessively increased as such increase would burden the storage, transmission, and modification capacities of the mask pattern.

In accordance with the foregoing and other objects of the invention, there is provided a new and improved method for downsizing the graphic data of a mask pattern stored in a hierarchical graphic database. The method comprises the steps of: (1) downsizing the hierarchical graphic database; (2) flattening the downsized hierarchical graphic database; (3) oversizing the flattened hierarchical graphic database; (4) undersizing the oversized hierarchical graphic database; (5) performing a logical-NOT operation on the undersized hierarchical graphic database, and the flattened downsized hierarchical graphic database, so as to obtain a gap-filling graphic element; and (6) incorporating the gap-filling graphic element in the downsized hierarchical graphic database.

BRIEF DESCRIPTION OF THE DRAWINGS

The invention can be more fully understood from the following detailed description of the preferred embodiments with reference to the accompanying drawings, wherein:

FIGS. 5A–5I are schematic diagrams depicting the steps involved in the method according to the invention to downsize a mask pattern stored in a hierarchical graphic database;

DETAILED DESCRIPTION OF THE PREFERRED EMBODIMENT

Figure 1A:
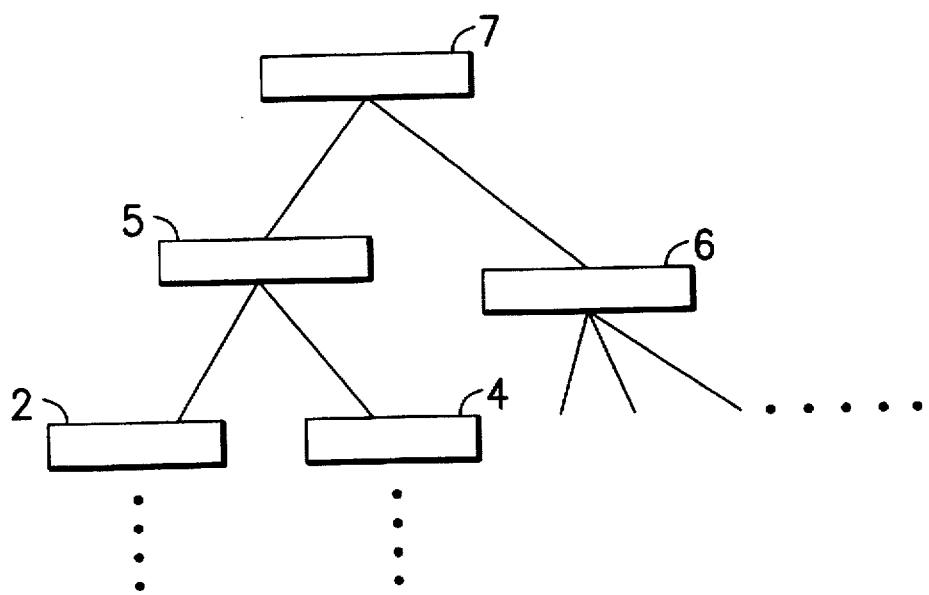
FIG. 1A is a schematic diagram showing the tree-like hierarchical structure of a typical hierarchical graphic database.
Figure 1B:
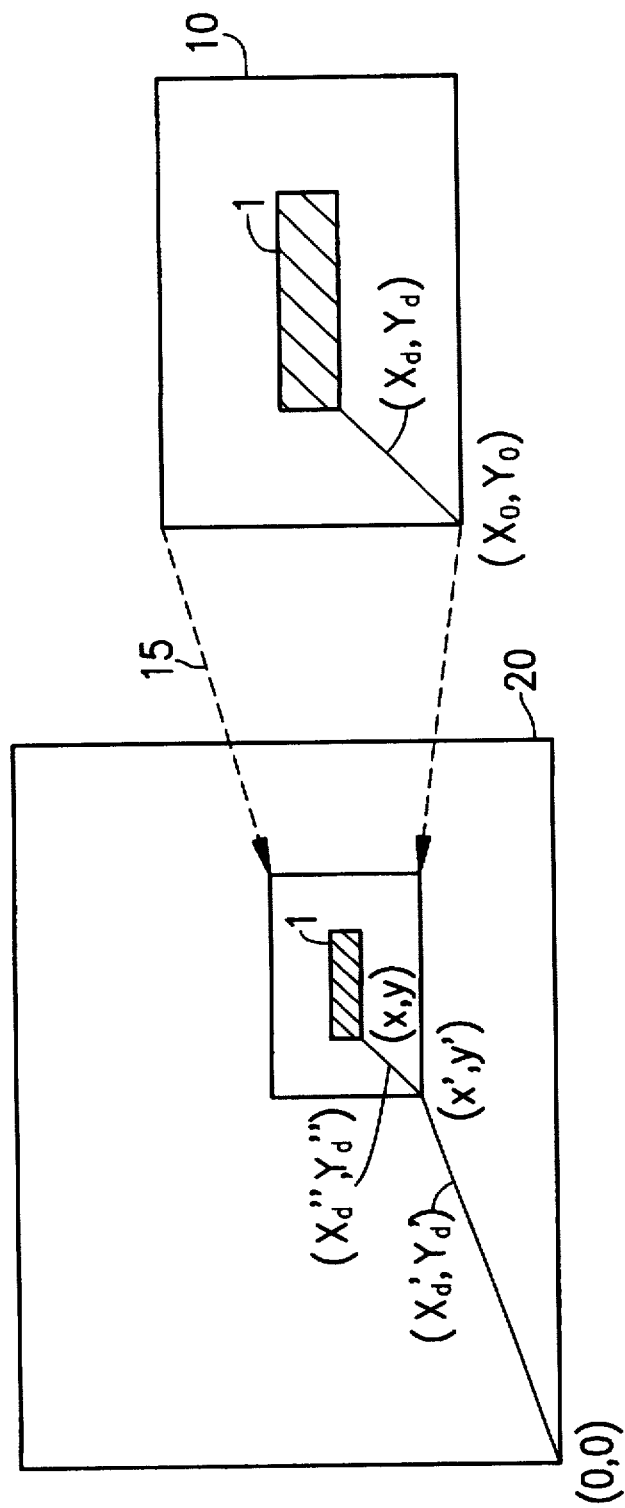
FIG. 1B is a schematic diagram depicting how a graphic element in a mask pattern is stored in a child group in a hierarchical graphic database.
Figure 2A:
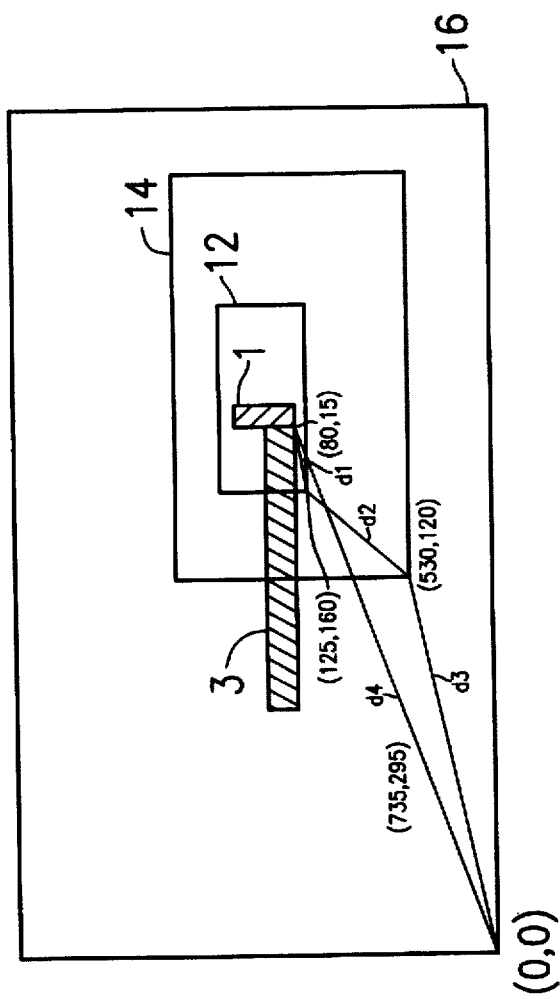
FIG. 2A is a schematic diagram depicting how two graphic elements in a mask pattern are to be recombined from three groups in a hierarchical graphic database.
Figure 2B:
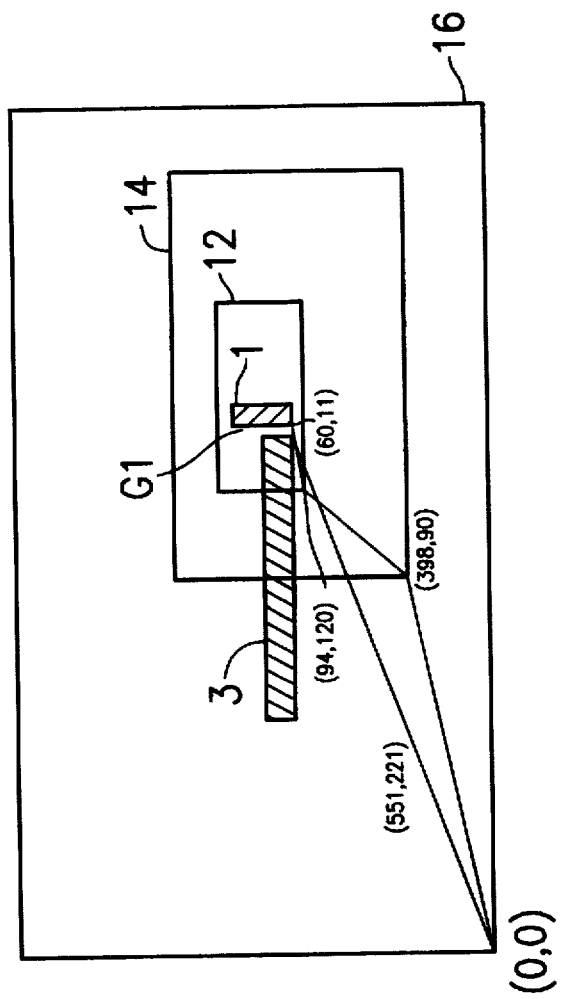
FIG. 2B is a schematic diagram depicting how the recombination of two graphic elements shown in FIG. 2A is formed with an undesired gap therebetween due to rounding of computed values.
Figure 2C:
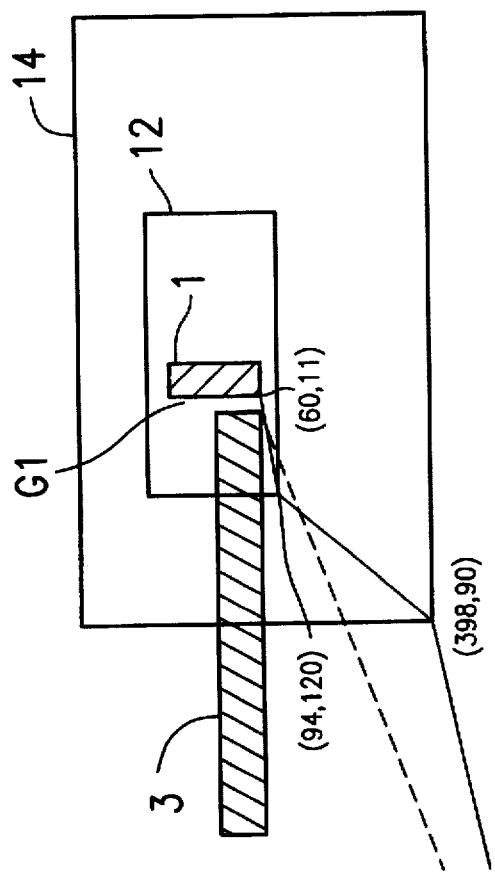
FIG. 2C shows an enlarged view of part of FIG. 2B.
Figure 3B:
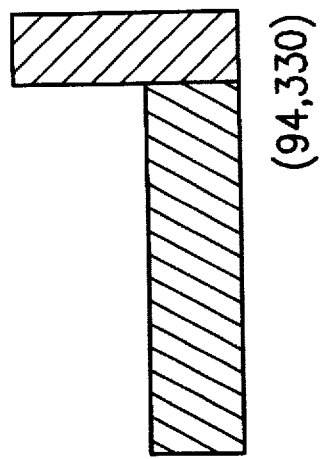
FIG. 3B shows the downsizing of the two graphic elements shown in FIG. 3A.
Figure 3A:
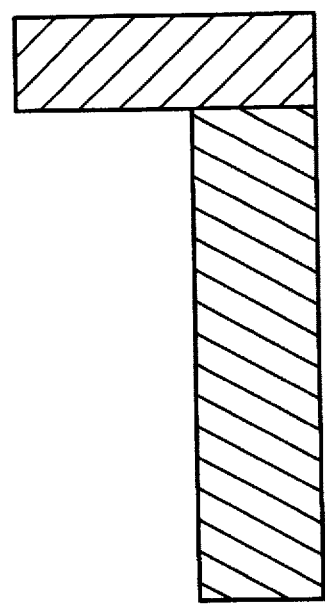
FIG. 3A shows two graphic elements in a mask pattern, that are recombined from a hierarchical graphic database by a conventional method to prevent an undesired gap.
Figure 4A:
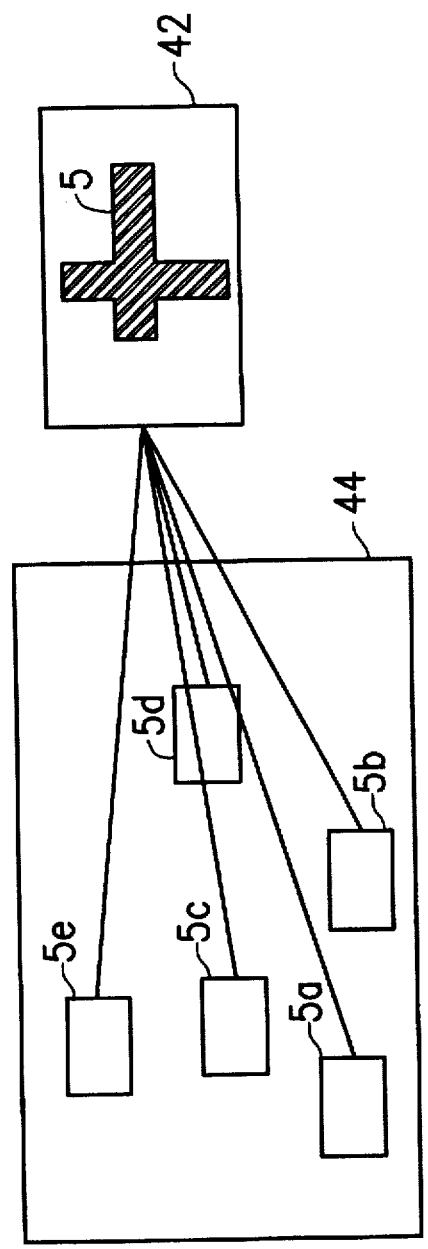
FIG. 4A is a schematic diagram showing how a graphic element in a child group is repetitively used in a parent group.
Figure 4B:
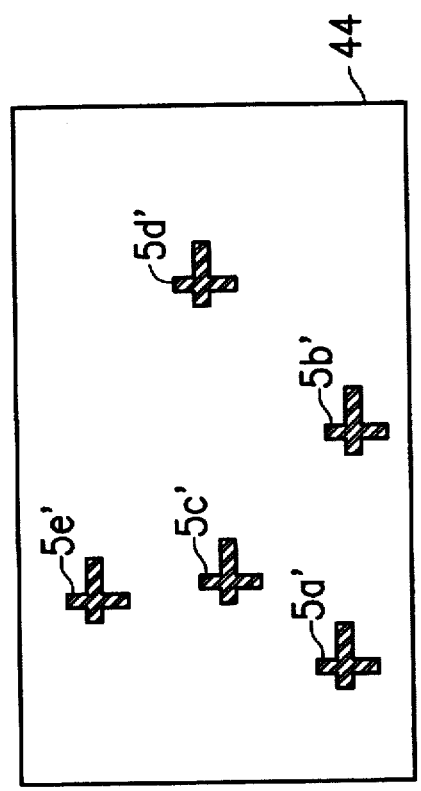
FIG. 4B shows a mask pattern consisting of a repetitively used graphic element based on the hierarchical structure shown in FIG. 4A.

Referring to FIGS. 5A–5I, there are shown schematic diagrams depicting the steps involved in the method according to the invention for downsizing a mask pattern stored in a hierarchical graphic database. For illustrative purpose, the mask pattern shown in FIG. 2A will also be used as an example in the following description of the method according to the invention, but is not to be regarded as a limitation to the scope of the invention.

Figure 5A:
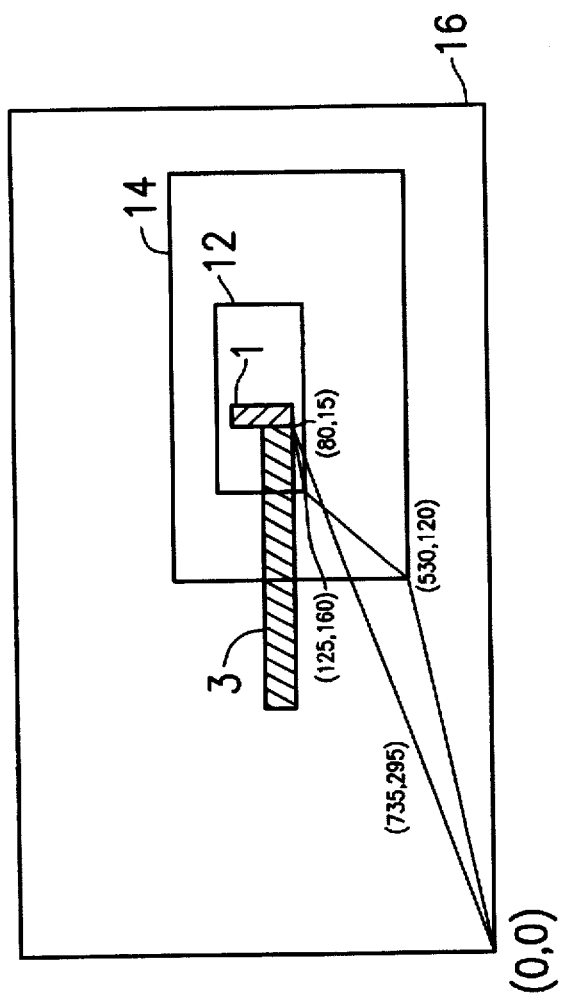

Referring to FIG. 5A, the hierarchical graphic database comprises groups 12, 14, 16 in different levels, for storing the graphic data of the mask pattern therein. The first level group 16 is a parent group selected as the target group which has its origin located at (0,0). The second level group 14 has transformation coordinates (530, 120) in the target group 16. The third level group 12 is a child to the second level group 14 and has transformation coordinates (125, 160) in group 14. The graphic element 1 in the child group 12 has transformation coordinates (80, 15) in group 12. Moreover, the graphic element 3 in the target group 16 has absolute coordinates (735, 295).

It can be shown through geometric transformation that the absolute coordinates of the graphic element 1 in the target group 16 are (735, 295). The graphic element 3 in the group 16 has the same absolute coordinates (735, 295) and therefore abuts the graphic element 1.

Figure 5B:
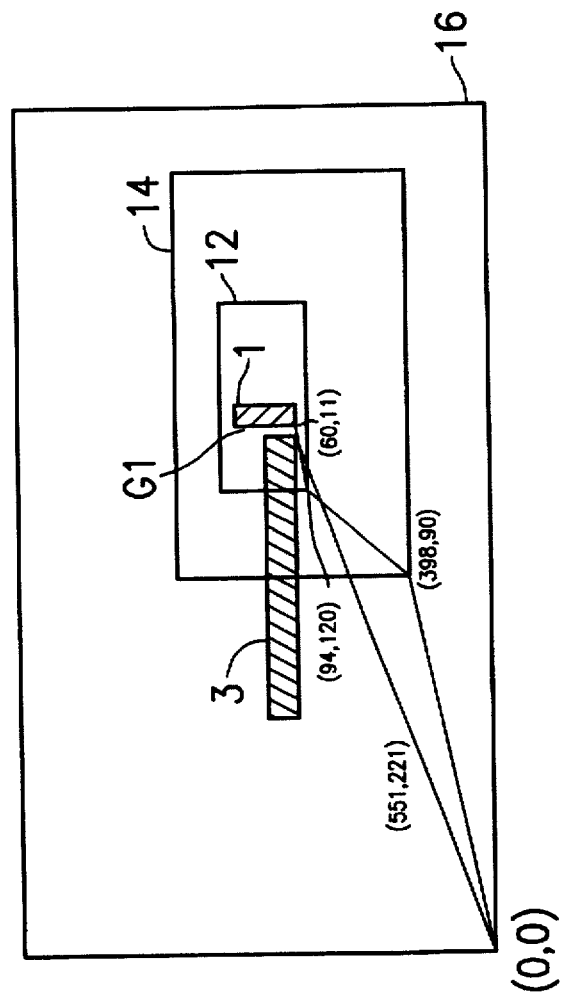

However, as shown in FIG. 5B, after multiplication by a downsizing factor of 75% in the target group 16, the absolute coordinate data for the graphic element 1 are (552, 221) and that for the graphic element 3 are (551, 221). As a consequence, the two graphic elements 1, 3 will be separated with a gap G1 therebetween. The reason for this result has been described in detail earlier with reference to FIG. 2A, so that description will not be repeated.

Figure 5C:
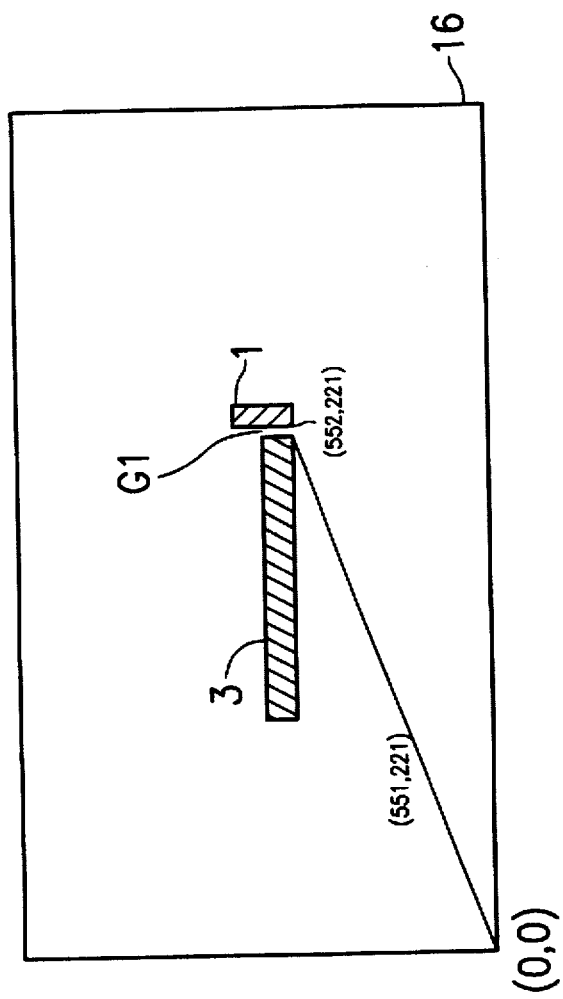

Referring further to FIG. 5C, in the next step the downsized hierarchical graphic data base is to be flattened. After flattening, the two graphic elements 1, 3 along with the gap G1 therebetween is plotted in the plane of the group 16 by reference to the origin (0,0). The transformation coordinates of the graphic element 1 are (552, 221) and those of the graphic element 3 are (551,221).

Figure 5D:
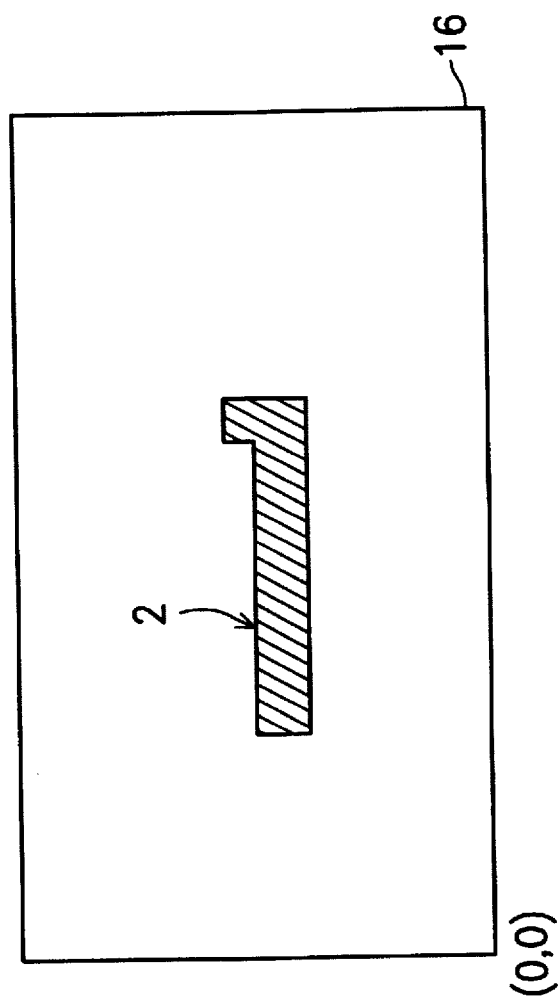
Figure 5E:
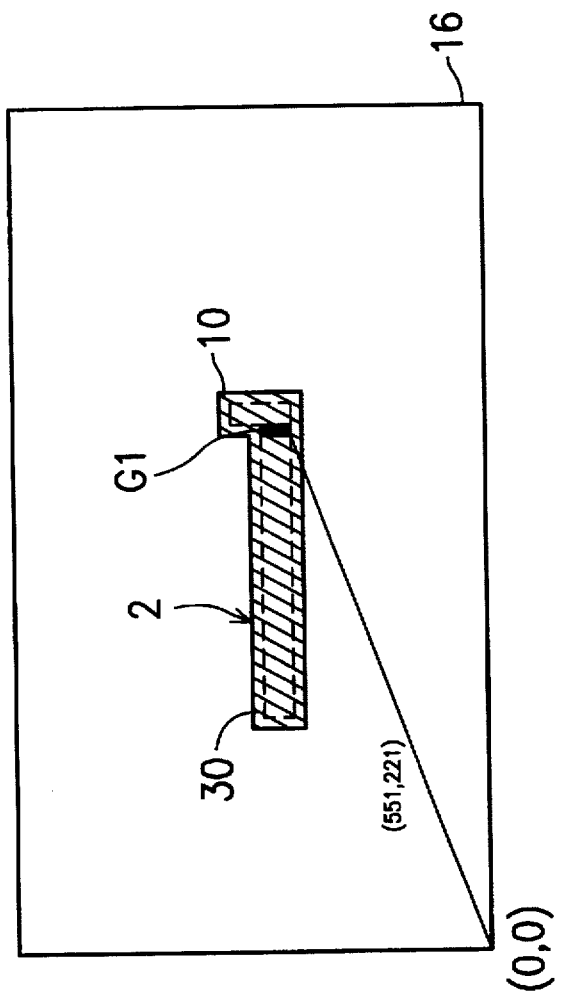

Referring to FIGS. 5D and 5E, in the next step, an oversizing operation is performed so as to expand the graphic elements 1, 3 to thereby eliminate the gap G1 therebetween. As shown in FIG. 5E, when the graphic elements 1, 3 are expanded by a specific oversizing factor, the graphic element 1 is enlarged to include an additional expanded area 10 and similarly the graphic element 3 is enlarged to include an additional expanded area 30. The gap G1 thus disappears due to the presence of the expanded areas 10 and 30 that take up the place of the area where the gap G1 originally lies. Furthermore, the expanded graphic elements 1, :3 are merged into an integral piece forming a graphic element 2.

Figure 5F:
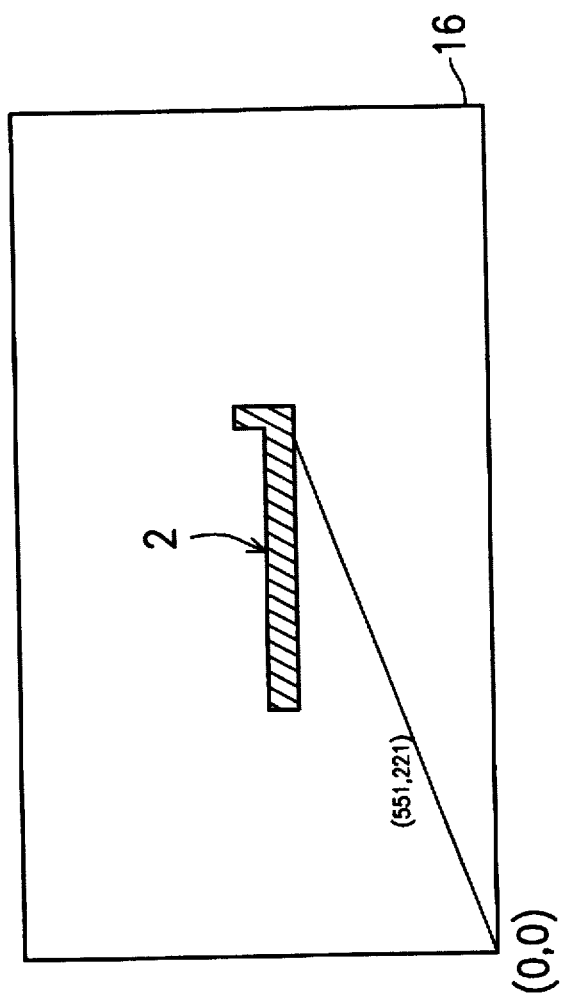
Figure 5G:
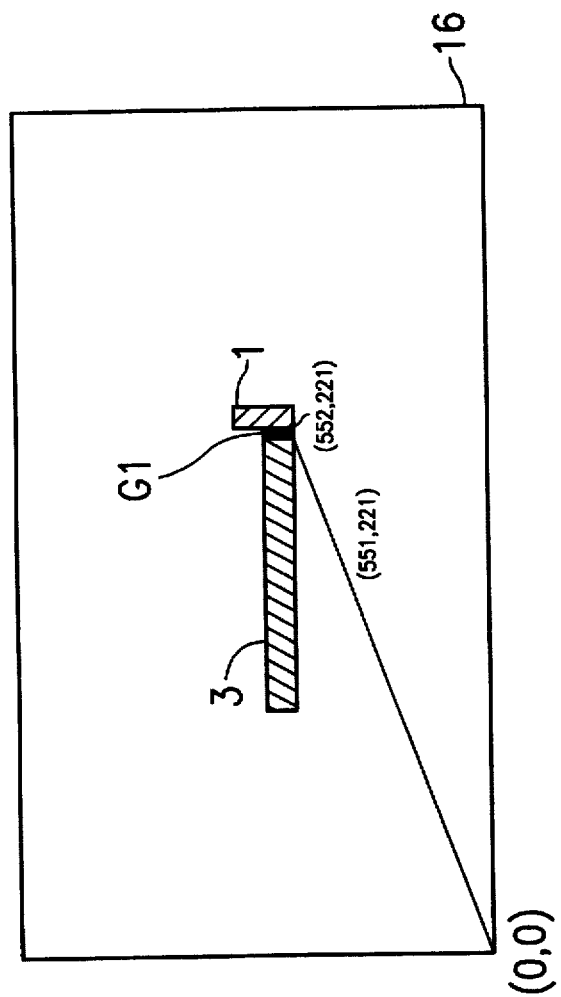

Referring further to FIGS. 5F and 5G, in the next step an undersizing operation is performed on the graphic element 2 so as to restore its size to match the original size of the graphic elements 1, 3. The undersizing factor is exactly equal to the oversizing factor used in the previous step. As illustrated in FIG. 5G, this operation allows the graphic elements 1, 3 to be reduced in size to match the original size of the original graphic elements 1, 3, and also allows elimination of the gap G1 that originally appeared between the graphic elements 1, 3, since the graphic element 2 is an integral graphic element.

Referring next to FIG. 5H, a logical-NOT operation for obtaining the gap-filling element 51 is performed on the integral graphic element shown in FIG. 5F and its predecessors, i.e., the downsized and flattened graphic elements 1, 3 shown in FIG. 5C. The thus obtained gap-filling graphic element 51 has the coordinates (551,221).

Figure 5I:
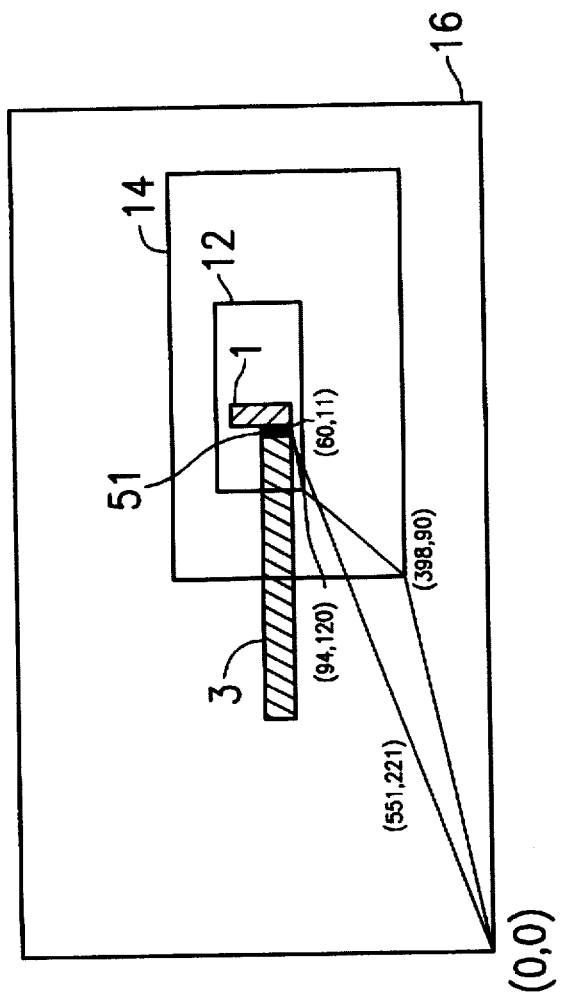

Referring to FIG. 5I, the gap-filling graphic element 51 obtained in the previous step is disposed precisely at the position where the gap G1 is located in the mask pattern shown in FIG. 5B. It will be recalled that in the step depicted in FIG. 5B, the target group 16 is multiplied by the 75% downsizing factor without flattening the hierarchical graphic database, and the gap-filling graphic element 51 and the gap G1 have the same coordinates (551,221). Accordingly, the gap-filling graphic element 51 can fill the gap G1 by directly incorporating it into the group 16. It will be noted that the original structure of the hierarchical graphic database is not disturbed throughout all the above-described steps of the method according to the invention.

It is also to be noted that, in order to prevent unrelated graphic elements from being merged and combined, there are two restrictions with which the oversizing factor should comply. First, as depicted in FIG. 6A, for two graphic elements 60, 61 that are separated by a space 65, the oversizing factor should comply with the following restriction so as to prevent the two graphic elements 60, 61 from being merged after oversizing:

$$(\text{oversizing distance}) \leq (\text{length of the space})/2 - (\text{coordinate unit}) \quad (1)$$

where the oversizing distance is the amount of increase in dimension of the graphic element, corresponding to the oversizing factor, and where the coordinate unit is the most fine granularity measurable for points on a graphic element. For example, assuming that an IC fabrication process is directed to a space of length 0.45 μm and the coordinate unit is 0.001 μm, then the oversizing factor should comply with the following restriction:

$$(\text{oversizing distance}) \leq (0.45)/2 - 0.0001 = 0.224 \ \mu m$$

Figure 6B:
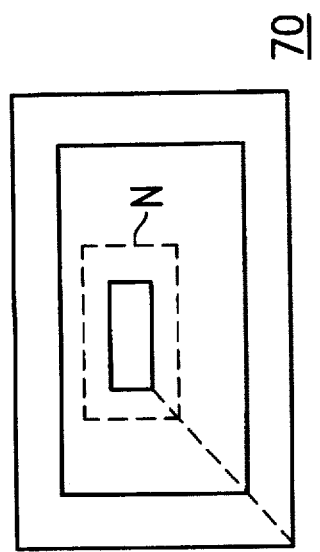
FIG. 6B is a schematic diagram depicting the restriction on the oversizing factor with respect to an N-level hierarchical graphic database.
Figure 6A:
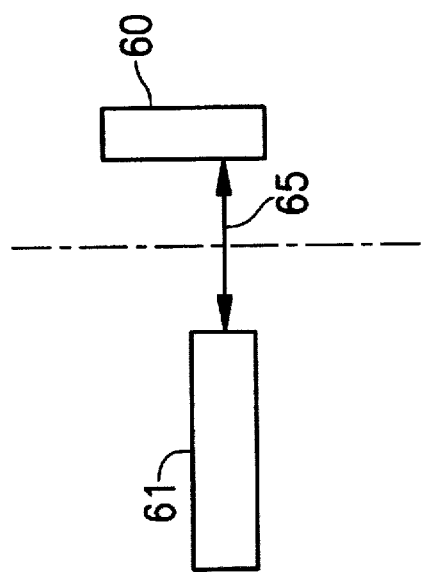
FIG. 6A is a schematic diagram depicting the restriction on the oversizing factor with respect to two graphic elements that are separated by a space.

Second, as depicted in FIG. 6B, since a hierarchical graphic database usually consists of a number of levels, for example N, the rounding errors of the coordinate data will accumulate during downsizing. Therefore, the oversizing distance corresponding to the oversizing factor should be not less than the greatest accumulated error in order to ensure that the oversizing step will overcome any resulting gap created by downsize rounding. In other words, the oversizing factor should comply with the following restriction:

$$(\text{oversizing distance}) \geq (\text{coordinate unit} \times N)/2 \div 2 \quad (2)$$
$$= (\text{coordinate unit} \times N)/4$$

where the term "(coordinate unit×N )/2" represents the largest gap possible due to rounding error, that is the length of the space 65 in FIG. 6A resulting from same direction errors in every level of the N levels. For example, assuming that the hierarchical graphic database consists of 20 levels and the coordinate unit is 0.001 μm, then the oversizing factor should provide an oversizing distance according to the following:

(oversizing distance)≧(0.001×20)/4=0.005 μm

In conclusion, the method according to the invention for downsizing a mask pattern has several advantages over the state of the art. For example, since when the mask pattern is downsized, gaps between two abutting graphic elements are filled with supplementary generated graphic elements, the overall hierarchical structure for recording and relating all the graphic elements in the mask pattern will not be disturbed or modified. Further, since the flattening procedure is carded out only in some steps of the method according to the invention and resulting data need not be saved, the burdens on the storage, transmission, and modification of the mask pattern are eliminated. Also, gaps formed between two graphic elements that are supposed to abut each other are eliminated, thus reproducing a mask pattern consisting of precisely disposed graphic elements that can be reproduced after downsizing.

The invention has been described above with exemplary embodiments. However, it is to be understood that the scope of the invention is not be limited to the disclosed embodiments. To the contrary, the invention includes various modifications and similar arrangements as would be understood by persons skilled in the art. The scope of the invention is limited only by the following appended claims, which should be accorded the broadest interpretation so as to encompass all such modifications and similar arrangements.

What is claimed is:

1. A method for downsizing a graphic image including a plurality of graphic elements stored in a hierarchical graphic database wherein at least two individual graphic elements abut, comprising the steps of:
   (1) downsizing the hierarchical graphic database;
   (2) flattening the downsized hierarchical graphic database;
   (3) oversizing the flattened hierarchical graphic database so as to form an integral graphic element of individual abutting graphic elements;
   (4) undersizing the oversized hierarchical graphic database;
   (5) performing a logical-NOT operation on the undersized hierarchical graphic database and the flattened hierarchical graphic database so as to obtain a gap-filling graphic element; and
   (6) incorporating the gap-filling graphic dement into the downsized hierarchical graphic database.

2. A method as claimed in claim 1, wherein in said step (1) the hierarchical graphic database is based on an N-level hierarchical structure consisting of a plurality of groups in the N levels and having at least a first level group serving as a root group, coordinates of the first level group serving as absolute coordinates for the graphic image.

3. A method as claimed in claim 2, wherein in said step (1) the root group serves as a parent group and any group referenced to the parent group serves as a child group, each child group being the parent group of any next lower level group.

4. A method as claimed in claim 3, wherein in said step (1) at least a parent group at a specific level is selected as a target group which is downsized by multiplication with a downsizing factor to obtain the downsized hierarchical graphic database.

5. A method as claimed in claim 4, wherein in said step (2) the flattened hierarchical graphic database is flattened within the target group.

6. A method as claimed in claim 5, wherein in said step (2) a gap is formed between at least a pair of abutting graphic elements after downsizing.

7. A method as claimed in claim 6, wherein said step (3) includes enlarging the pair of graphic elements to include additional expanded areas and merging the pair of graphic elements into an integral graphic element, the expanded areas making the gap disappear.

8. A method as claimed in claim 7, wherein in said step (3) the merging of the abutting graphic elements is achieved through a combination operation.

9. A method as claimed in claim 7, wherein in said step (3) an oversizing factor is used to oversize the flattened hierarchical graphic database.

10. A method as claimed in claim 9, wherein in said step (3) the oversizing factor is limited by the following restriction:

(coordinate unit×N)/4 ≦ (oversizing distance) ≦ (length of the space between two separated graphic elements)/2−(coordinate unit), wherein the "oversizing distance" is an amount of increase in dimension of each graphic element, corresponding to the oversizing factor, and wherein the "coordinate unit" means the unit of the coordinates of the elements of the database.

11. A method as claimed in claim 9, wherein in said step (4) an undersizing factor is used to undersize the oversized flattened hierarchical graphic database.

12. A method as claimed in claim 11, wherein in said step (4) the undersizing factor is equal to the oversizing factor.

13. A method as claimed in claim 12, wherein in said step (5) the gap-filling graphic element is of a size identical to that of the gap and is referenced to absolute coordinates identical to those of the gap.

14. A method as claimed in claim 13, wherein in said step (6) the gap-filling graphic element is put into the target group and referenced to the same absolute coordinates as the gap.

15. A method as claimed in claim 13, wherein said step (6) includes the step of adding a group as a child group of the target group and incorporating the gap-filling graphic element via the child group, so that the target group references the gap-filling graphic element.

16. A method for downsizing a mask pattern stored in a hierarchical graphic database including of a plurality of groups in corresponding levels, for use in a semiconductor fabrication process, a specific group serving as a target group, wherein at least two individual graphic elements abut, comprising the steps of:
   (1) multiplying the target group by a downsizing factor so as to downsize the hierarchical graphic database;
   (2) flattening the downsized hierarchical graphic database;
   (3) oversizing the flattened hierarchical graphic database so as to form an integral graphic element of individual abutting graphic elements;
   (4) undersizing the oversized hierarchical graphic database;
   (5) performing a logical-NOT operation on the undersized hierarchical graphic database and the flattened hierarchical graphic database so as to obtain a gap-filling graphic element; and
   (6) incorporating the gap-filling graphic element into the downsized hierarchical graphic database.

17. A method as claimed in claim 16, wherein in said step (1) the plurality of groups are in an N-level hierarchical structure and includes at least a first level group serving as a root group, the coordinates of the first level group serving as absolute coordinates for a graphic image.

18. A method as claimed in claim 17, wherein in said step (1) the root group serves as a parent group and any group referenced to the parent group serves as a child group, each child group being the parent group of any next lower level group.

19. A method as claimed in claim 18, wherein in said step (1) the downsizing factor is in a range from 0 to 1.

20. A method as claimed in claim 18, wherein in said step (2) a gap is formed between at least a pair of abutting graphic elements.

21. A method as claimed in claim 20, wherein said step (3) includes enlarging the pair of graphic elements to include additional expanded areas, and merging the pair of graphic elements into an integral graphic element, the expanded areas making the gap disappear.

22. A method as claimed in claim 21, wherein in said step (3) the merging of the abutting graphic elements is achieved through a combination operation.

23. A method as claimed in claim 21, wherein in said step (3) an oversizing factor is used to oversize the flattened hierarchical graphic database.

24. A method as claimed in claim 23, wherein groups contain graphic elements and wherein in said step (3) the oversizing factor is limited by the following restriction:

(coordinate unit×N)/4 ≦ (oversizing distance) ≦ (length of the space between two separated graphic elements)/2−(coordinate unit), wherein the "oversizing distance" is an amount of increase in dimension of each graphic element, corresponding to the oversizing factor, and wherein "coordinate unit" means the unit of coordinates of graphic elements.

25. A method as claimed in claim 23, wherein in said step (4) an undersizing factor is used to undersize the oversized flattened hierarchical graphic database.

26. A method as claimed in claim 25, wherein in said step (4) the undersizing factor is equal to the oversizing factor.

27. A method as claimed in claim 26, wherein in said step (5) the gap-filling graphic element is of the same size and referenced to identical absolute coordinates as the gap.

28. A method as claimed in claim 27, wherein in said step (6) the gap-filling graphic element is put into the target group and referenced to the same absolute coordinates as the gap.

29. A method as claimed in claim 27, wherein said step (6) includes the step of adding a group as a child group of the target group and incorporating the gap-filling graphic element via the child group so that the target group references the gap-filling graphic element.

\* \* \* \* \*